United States Patent [19]
Chang

[11] Patent Number: 5,275,872
[45] Date of Patent: Jan. 4, 1994

[54] POLYCRYSTALLINE SILICON THIN FILM TRANSISTOR

[75] Inventor: Kun-Zen Chang, Hsinchu, Taiwan

[73] Assignee: Industrial Technology Research Institute, Hsinchu, Taiwan

[21] Appl. No.: 742,412

[22] Filed: Aug. 8, 1991

Related U.S. Application Data

[62] Division of Ser. No. 577,156, Sep. 4, 1990, Pat. No. 5,064,775.

[51] Int. Cl.$^5$ .............................................. B32B 17/00
[52] U.S. Cl. ..................................... 428/210; 428/336; 428/428; 428/432; 428/446; 428/472; 428/702; 428/901; 428/701; 257/347
[58] Field of Search ............... 357/23.7; 428/195, 210, 428/428, 446, 701, 331, 336, 472, 432, 901, 702

[56] References Cited

U.S. PATENT DOCUMENTS

| | | | |
|---|---|---|---|
| 4,178,191 | 12/1979 | Flatley | 437/21 |
| 4,489,104 | 12/1984 | Lee | 427/101 |
| 4,673,531 | 6/1987 | Lee | 252/512 |
| 4,682,407 | 7/1987 | Wilson | 437/24 |
| 4,772,927 | 9/1988 | Saito | 357/23.7 |
| 4,866,006 | 9/1989 | Imagawa | 437/101 |

OTHER PUBLICATIONS

"Polycrystalline-Silicon Device Technology for Large-Area Electronics," IEEE Transactions on Electron Devices, 33, 4, 477–481.

*Primary Examiner*—Ellis P. Robinson
*Assistant Examiner*—Timothy M. Speer
*Attorney, Agent, or Firm*—George O. Saile

[57] ABSTRACT

An improved field effect transistor having a source region, a drain region, and channel region in a polycrystalline silicon layer, the improvement being that the polycrystalline silicon layer has approximately equal concentrations of N and P type dopants embodied therein, which serves to restrain movement of P/N junctions.

7 Claims, 2 Drawing Sheets

POLYCRYSTALLINE SILICON THIN FILM TRANSISTOR

This application is a division of application Ser. No. 07/577,156, filed Sep. 4, 1990, now U.S. Pat. No. 5,064,775.

BACKGROUND OF THE INVENTION

(1) Field of the Invention

This invention relates, in general, to stabilizing the properties of polycrystalline semiconductor layers, more particularly to controlling impurity migration in thin polycrystalline silicon layers during high temperature processing, and specifically to field effect transistors fabricated in thin film polycrystalline or amorphous layers.

(2) Description of Prior Art

In the quest to achieve microminiturization of integrated circuit devices, individual elements have been made very small, and the elements have been closely packed. Further, transistor devices and resistors have been fabricated in thin polycrystalline semiconductor films that are positioned on electrically insulating layers over elements fabricated in a semiconductor body, thus materially increasing the packing density. Also devices have been fabricated directly on insulating substrates. In the fabrication of very small devices in thin polycrystalline silicon films a major problem is controlling the dopant migration in the films during the necessary high temperature process following introduction of the dopant into the film. For example, when polycrystalline silicon is used, large concentrations of dopants, such as arsenic, boron, or phosphorous are implanted into very small regions of the polycrystalline silicon film. High temperature steps are used to activate the implanted dopant. Also other high temperature steps may be necessary to deposit or grow insulating layers, deposit metals, etc. During such high temperature exposure the dopants will diffuse very rapidly. In view of the very small dimensions of the regions even a small dopant movement is likely to seriously degrade the devices.

While these problems can be partially overcome by reducing the dopant concentration, the lower dopant values may make it impossible to obtain sufficiently low sheet resistance. Also, where it is desired to selectively dope polysilicon regions in a specific location, but not in an adjacent location, the rapid vertical and/or lateral movement of the dopant through the polysilicon material during high temperature processing makes it impossible to standardize device parameters and operating conditions. U.S. Pat. No. 4,682,407 discloses and claims a process for controlling dopant migration in a polycrystalline semiconductor layers consisting of implanting oxygen or nitrogen into the polysilicon layer and heating. The implanted oxygen is believed to stabilize the grain boundaries of the polycrystalline silicon layer so that grain boundary diffusion is decreased. U.S. Pat. No. 4,489,104 discloses a process for fabricating a resistor in a polycrystalline silicon film. In the process a polysilicon film is deposited, an N type dopant blanket implanted in the film, the doped film heat treated, a second opposite P type dopant selectively implanted to define the region of the resistor, and the P type dopant activated by heat treatment. Diffusion of the P type dopant is restrained because there is no dopant concentration between the heavily doped N region and the P type resistor region.

FIG. 1 illustrates the cross section of a conventional polysilicon thin film transistor, the transistor consists of semiconductor or insulator substrate 10, a insulating layer 11 on the top surface of substrate 10, and a thin film polysilicon layer 14 with an overlying insulating layer 21. Polysilicon layer 14 has a source region 16, a drain region 18, and a channel region 20 therein. A polysilicon gate electrode 22 overlies the channel region 20. In order to achieve a stable and workable field effect transistor, it is apparent that the source and drain regions must remain stable within polysilicon layer 14.

While the prior art recognizes the need to stabilize dopants in a polysilicon layer during high temperature operations, none has effectively done so, particularly in the fabrication of transistor devices.

SUMMARY OF THE INVENTION

An object of the present invention is to provide an effective process for producing a transistor in a thin polysilicon film, wherein dopant migration in the film is controlled during high temperature process steps.

Another object of the present invention is to provide a field effect transistor in a polysilicon thin film that has a consistently better defined channel region due to a modified polysilicon material.

In accordance with the above objects there is provided a transistor of the invention having a source region, a drain region and a channel region in a polysilicon layer supported on an insulating substrate, wherein the improvement is providing additional P and N type dopants in the polycrystalline layer in approximately concentrations in excess of $1 \times 10^{16}$ to about $1 \times 10^{20}$ cm.$^{-3}$, and uniformly distributed throughout the layer.

DETAILED DESCRIPTION OF THE PREFERRED EMBODIMENTS

The present invention will be described in detail with reference to the accompanying drawings. It should be noted that the drawings are in greatly simplified form, and illustrate only the transistor structure. In practice, the transistor will be only one of many supported on a common substrate and interconnected with suitable metallurgy into various electronic circuit configurations. The substrate may be a monocrystalline semiconductor body with many devices fabricated therein, as is well known in the art, with the transistor formed on a suitable insulating layer in stacked relation to the aforedescribed devices.

Figure 1:
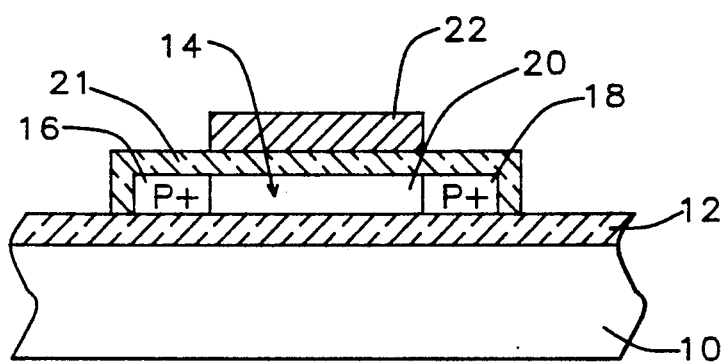
FIG. 1 is a sectional view, in greatly exaggerated scale, that illustrates a conventional thin film transistor.
Figure 2:
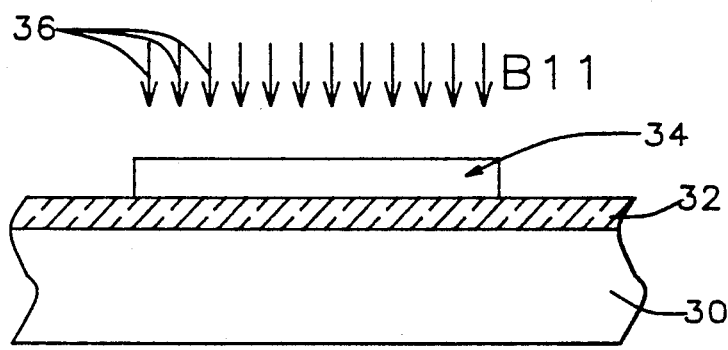
FIGS. 2 through 6 are sectional views, in greatly exaggerated scale, that illustrate the sequential steps for producing the improved thin film transistor of the present invention.

Referring now to the drawings, and to FIG. 2 in particular, there is illustrated a substrate 30. Substrate 30 can be of any suitable material, such as silicon, either amorphous, polycrystalline or monocrystalline, glass, quartz, saphire, ceramic, aluminum oxide, etc. Normally the substrate will be provided with an insulating layer 32 on at least the top surface of the substrate 30. The layer 32 could be a field oxide layer on a monocrystalline silicon substrate, or a thin oxide layer over associated elements of the device. A polycrystalline semiconductor or amorphous semiconductor layer 34 is deposited over layer 32 using known technology, such as low pressure chemical vapor deposition, sputter deposition, etc. to the desired thickness. The thickness of the polycrystalline layer 34 is typically in the range of 500 to 5000 Angstroms, more specifically from 500 to 1,000 Angstroms. The semiconductor material of layer 34 can be of any type, such as silicon, germanium, gallium arsenide, etc, but is most preferably silicon. A first dopant for semiconductors is then introduced into layer 34, preferably by ion implantation techniques. As illustrated in FIG. 2, boron is implanted, as indicated by arrows 36. The dopant concentration in the layer 34 is in the range of $1 \times 10^{16}$ to $1 \times 10^{20}$ cm.$^{-3}$, more preferably in the range of $5 \times 10^{18}$ to $5 \times 10^{19}$ cm$^{-3}$. The most preferred technique is to ion implant B11 with a dosage of $2 \times 10^{14}$ cm.$^{-2}$ at an acceleration voltage of about 25 Kev.

Figure 3:
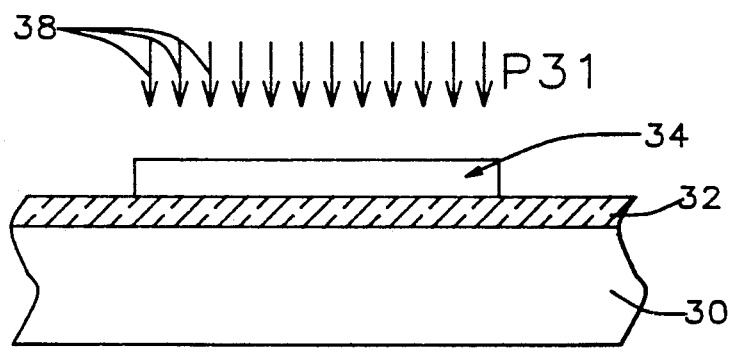

As shown in FIG. 3, a second opposite type dopant for semiconductors is introduced into polycrystalline silicon layer 34, as indicated by arrows 38. The dopant is of the opposite type of that previously introduced, and in a quantity approximately equal to the first dopant. Again, any suitable technique can be used to introduce the dopant into the layer. Ion implantation, however, is the preferred technique. The concentration ranges are the same as previously described, the most preferred technique is ion implant P$^{31}$ with a dosage of $2 \times 10^{14}$ cm.$^{-2}$ at an acceleration voltage of 50 Kev.

Figure 4:
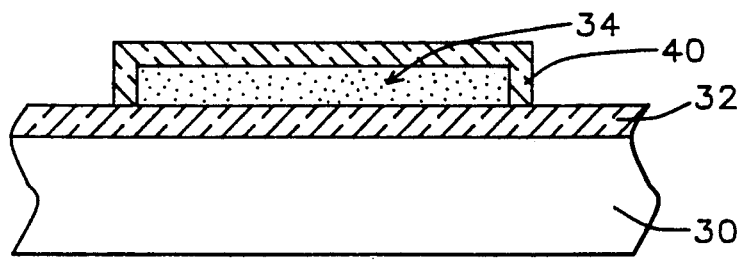

As shown in FIG. 4 an insulating layer 40 is formed over the surface of polysilicon layer 34. The layer 40 can be of any suitable material, and will serve as the gate oxide beneath the gate, which will subsequently be formed. Preferably layer 40 is a thin layer of thermally grown silicon dioxide with a thickness in the range of 200 to 1500 Angstroms, more preferably from 200 to 500 Angstroms. Preferably the layer 40 is formed by heating the polysilicon layer 34 in a dry oxygen environment at a temperature of about 900° C. for a time of 30 minutes.

Since the implanted polysilicon layer 34 must be annealed, the formation of layer 40 can serve as the complete or a partial anneal thereof. Layer 34 can be separately annealed, which recrystallizes the polysilicon, by heating it to a temperature in the range of 600 C. to 1000 C. for a time in the range of 10 to 60 minutes. Most preferably, the anneal of layer 34 is achieved by heating it to a temperature of approximately 900° C. for a time of approximately 30 minutes. The polycrystalline silicon material of layer 34 is now modified by the introduction of the two opposite type dopants followed by an anneal.

The average grain size of polysilicon layer 34 is about 0.5 micrometers. The dopants which include boron and phosphorous atoms are trapped in the grain boundary after the annealing process. The grain boundaries with the trapped dopants will prevent interdiffusion of the dopants from the source 16 and drain 18 regions to be introduced. The result of this prevention of interdiffusion between the source 16 and drain 18 will be stable channel region during and after the back end heat processing. Therefore, the short channel thin film transistor devices which may have a channel of less than about 1.0 micrometers will be manufacturable. Although threshold voltage and carrier mobility will be slightly increased, the operating conditions of these devices are satisfactory.

As shown in FIG. 4 the gate electrode is formed over polysilicon layer 34. Most preferably the gate electrode is formed by depositing a blanket layer of polysilicon and forming the gate electrode 42 by substrate etching techniques. The gate electrode 42 will have a thickness in the range of 1000 to 6000 Angstroms, more preferably in the range of 2000 to 4000 Angstroms.

Figure 6:
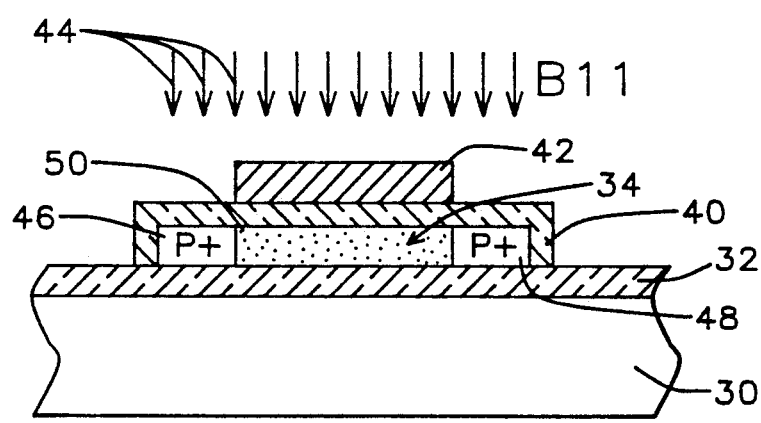

As shown in FIG. 6 dopants are introduced into the polysilicon layer 34, to form the source region 46 and the drain region 48, which define the channel region 50, as indicated by arrows 44. At the same time dopants are introduced into the gate 42 making it electrically conductive. The most preferred technique for forming the source and drain regions is to ion implant B11 with a dosage of $5 \times 10^{15}$ cm.$^{-2}$ at an acceleration voltage of 25 Kev.

The remaining steps of forming an insulating layer over the structure, and forming the interconnecting metallurgy to produce a complete operative device are well known and will not be described. It is also understood that both N and P channel FET devices can be formed using the aforedescribed process by varying the choice of dopants.

Another variation of the aforedescribed process of the invention involves hydrogenation of the polysilicon layer 34. The hydrogen passivation process is usually carried out after the device process is finished. The purpose of this process in the present invention is to reduce the threshold voltage of the polysilicon thin film transistor. During the hydrogen passivation process, the hydrogen ions generated from decomposing ammonia gas by plasma equipment are combined with dangling bonds of silicon atoms located at the grain boundaries to accomplish the passivation of the structure. After the process of combining hydrogen ions and dangling silicon bonds, the localized electric field will be reduced resulting in a lower threshold voltage of the polysilicon thin film transistor. This is particularly effective in the present process, because the heat applied during the process will not cause the dopants from the source and drain regions to move into the channel region.

EXAMPLE

A polysilicon thin film transistor device was fabricated on the silicon substrate 30 with the silicon dioxide layer 32 to prove the operability of the invention. The silicon dioxide layer was 8000 Angstrom in thickness. The polysilicon thin film 34 with a thickness of 1000 Angstroms was deposited onto the layer 32 in a low pressure chemical vapor deposition system. After the polysilicon film 34 deposition, boron dopant 36 was implanted into the polysilcon film. The implant dose and energy were $1 \times 10^{14}$ cm.$^2$ and 25 Kev., respectively. An annealing process was carried out in a nitrogen ambient with temperature and time of 900° C. and 30 minutes, respectively. This produces the FIG. 2 structure.

Phosphorous ions 38 was implanted into the polysilicon layer 34 as seen in FIG. 3. The implant dose and energy were $1 \times 10^{14}$ cm.$^{-2}$ and 25 Kev., respectively. The structure was then annealed in a nitrogen ambient with a temperature of 900° C. and for 30 minutes. After the annealing process was finished, the pattern is etched by lithographic techniques.

The gate silicon dioxide 40 with a thickness of 350 Angstroms was grown on the polysilicon film 34. The growth process was carried out in a dry oxygen furnace with a temperature of 900° C. and for 30 minutes to produce the FIG. 4 structure.

Figure 5:
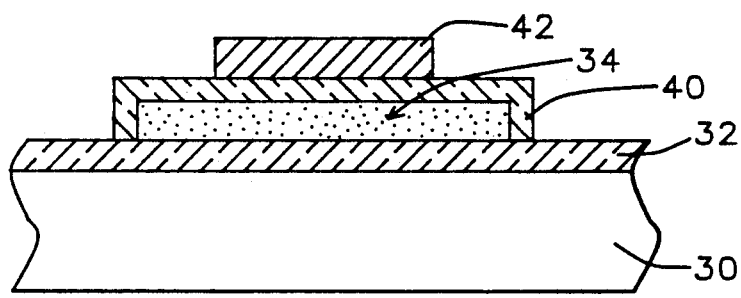

The polysilicon gate electrode 42 was deposited and doped. The gate layer 42 with a thickness of 4500 Angstroms was doped by POCl$_3$ diffusion to produce conducting electrode. The gate pattern was etched by lithographic process techniques. The deposition, POCl$_3$ diffusion and patterning process is the same as conventional thin film transistor processing. The result of these processes is shown in FIG. 5.

The boron implantation 44 was carried out to form the source 46 and drain 48 regions as shown in FIG. 6. The implant dose and energy are $1\times10^{15}$ cm.$^{-2}$ and 25 Kev., respectively.

Surface passivation, contact etch and metallization processes were carried out after the source and drain implant process. These processes are the same as conventional thin film transistor fabrication processes and therefore are not described.

The resulting thin film transistor was tested and found to be satisfactorily operative.

While the invention has been particularly shown and described with reference to the preferred embodiments thereof, it will be understood by those skilled in the art that various changes in form and details may be made without departing from the spirit and scope of the invention.

What is claimed is:

1. A field effect transistor having a source region, a drain region, and a channel region in a polycrystalline silicon layer supported on an insulating substrate of a material selected from the group consisting of silicon, glass, quartz, sapphire, ceramic, and aluminum oxide; said entire polycrystalline silicon layer having a thickness in the range of 500 to 5000 Angstroms and, having embodied therein approximately equal concentrations of P and N type dopants that are uniformly distributed, said dopants each being present in a concentration in the range of $1\times10^{16}$ to $1\times10^{20}$ atoms/cm$^3$, and spaced apart source and drain regions in said polycrystalline silicon layer defining a channel region there between, the resultant modified polycrystalline silicon layer effectively limiting the lateral diffusion of the dopants forming the source and drain regions thereby providing a stable channel region length.

2. The semiconductor device of claim 1 wherein said polycrystalline silicon layer has a thickness in the range of 500 to 1000 Angstroms and a grain size in the range of 0.05 to 1.0 micrometers.

3. The semiconductor device of claim 2 wherein said P and N type impurities are phosphorus and boron respectively, each in a concentration in the range of $1\times10^{16}$ to $1\times10^{20}$ cm$^{-3}$.

4. The semiconductor device of claim 3 wherein the concentrations of phosphorous and boron are in the range of $5\times10^{18}$ to $5\times10^{19}$ cm$^{-3}$.

5. The field effect transistor of claim 4 wherein said polycrystalline silicon layer is hydrogenated.

6. The field effect transistor of claim 2 wherein said substrate is a monocrystalline silicon body with an overlying layer of silicon dioxide.

7. The field effect transistor of claim 2 wherein said channel width is in the range of 0.5 to 20 micrometers.

* * * * *